(12) United States Patent
Yee et al.

(10) Patent No.: US 11,265,980 B2
(45) Date of Patent: *Mar. 1, 2022

(54) DEVICES HAVING DEDICATED LIGHT EMITTING DIODES FOR PERFORMANCE CHARACTERIZATION

(71) Applicant: Facebook Technologies, LLC, Menlo Park, CA (US)

(72) Inventors: Michael Yee, Kirkland, WA (US); Ramakrishna Chilukuri, San Jose, CA (US); William Thomas Blank, Bellevue, WA (US); Ilias Pappas, County Cork (IE)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/821,776

(22) Filed: Mar. 17, 2020

(65) Prior Publication Data

US 2021/0267029 A1 Aug. 26, 2021

(30) Foreign Application Priority Data

Feb. 20, 2020 (GR) .............................. 20200100087

(51) Int. Cl.
*H05B 45/14* (2020.01)
*H05B 47/105* (2020.01)
(Continued)

(52) U.S. Cl.
CPC ......... *H05B 45/14* (2020.01); *G01R 31/2635* (2013.01); *H05B 45/345* (2020.01);
(Continued)

(58) Field of Classification Search
CPC . G01R 31/2635; H05B 45/14; H01L 25/0753; H01L 33/06; H01L 33/10; H01L 33/24; H01L 33/62
See application file for complete search history.

(56) References Cited

U.S. PATENT DOCUMENTS

2004/0070558 A1 4/2004 Cok et al.
2005/0280766 A1* 12/2005 Johnson ............... G09G 3/3216
349/167
(Continued)

OTHER PUBLICATIONS

PCT Application No. PCT/US2021/013175, "International Search Report and Written Opinion", dated Apr. 30, 2021, 12 pages.
(Continued)

*Primary Examiner* — Henry Luong
(74) *Attorney, Agent, or Firm* — Weaver Austin Villeneuve & Sampson LLP (57) ABSTRACT

A device includes a plurality of first LEDs, a plurality of second LEDs, at least one controllable current source that is configured to generate at least one bias current for driving the plurality of first LEDs and the plurality of second LEDs, and a plurality of measurement circuits, each of which is configured to measure a current-voltage (I-V) performance characteristic of at least one of the plurality of first LEDs. A property of a first bias current of the at least one bias current is determined as a function of at least two measurements of the I-V performance characteristic of the at least one of the plurality of first LEDs, and the at least two measurements of the I-V performance characteristic are acquired while the first bias current is applied to the at least one of the plurality of first LEDs and the plurality of second LEDs.

19 Claims, 9 Drawing Sheets

(51) Int. Cl.
 H05B 45/40 (2020.01)
 H05B 45/46 (2020.01)
 H05B 45/345 (2020.01)
 G01R 31/26 (2020.01)
 H01L 25/075 (2006.01)
 H01L 33/06 (2010.01)
 H01L 33/10 (2010.01)
 H01L 33/24 (2010.01)
 H01L 33/62 (2010.01)

(52) U.S. Cl.
 CPC .......... *H05B 45/46* (2020.01); *H01L 25/0753* (2013.01); *H01L 33/06* (2013.01); *H01L 33/10* (2013.01); *H01L 33/24* (2013.01); *H01L 33/62* (2013.01)

(56) References Cited

U.S. PATENT DOCUMENTS

| 2010/0145645 A1 | 6/2010 | Gonopolskiy et al. |
| 2011/0084701 A1 | 4/2011 | Bancken et al. |
| 2019/0246479 A1 | 8/2019 | Kostrun |

OTHER PUBLICATIONS

PCT Application No. PCT/US2021/013415, "International Search Report and Written Opinion", dated Apr. 30, 2021, 15 pages.

\* cited by examiner

DEVICES HAVING DEDICATED LIGHT EMITTING DIODES FOR PERFORMANCE CHARACTERIZATION

CROSS-REFERENCE TO RELATED APPLICATION

This application claims priority under 35 U.S.C. § 119 to Greece Provisional Patent Application No. 20200100087, filed on Feb. 20, 2020, the contents of which are hereby incorporated by reference in their entirety for all purposes.

BACKGROUND

Aspects of the disclosure relate to characterizing the performance of light emitting diodes (LEDs) in an LED array. For example, an LED array may be used in various display technologies. As the display is operated, the LEDs within the LED array experience aging, which may cause the performance of some of all of the LEDs to decrease. This can diminish the user experience during the lifetime of the display.

SUMMARY

The present disclosure generally relates to devices that have dedicated test LEDs for performance characterization. According to an aspect of the invention, a device includes a plurality of first LEDs, a plurality of second LEDs, at least one controllable current source that is configured to generate at least one bias current for driving the plurality of first LEDs and the plurality of second LEDs, and a plurality of measurement circuits, each of which is configured to measure a current-voltage (I-V) performance characteristic of at least one of the plurality of first LEDs. A property of a first bias current of the at least one bias current is determined as a function of at least two measurements of the I-V performance characteristic of the at least one of the plurality of first LEDs. The at least two measurements of the I-V performance characteristic of the at least one of the plurality of first LEDs are acquired while the first bias current of the at least one bias current is applied to the at least one of the plurality of first LEDs and the plurality of second LEDs. The at least two measurements of the I-V performance characteristic of the at least one of the plurality of first LEDs are acquired at different times.

The at least two measurements of the I-V performance characteristic of the at least one of the plurality of first LEDs may include a first measurement that is made upon completion of manufacturing of the device and a second measurement that is made upon turning on the device. Alternatively or in addition, the at least two measurements of the I-V performance characteristic of the at least one of the plurality of first LEDs may include a third measurement that is made after turning off the device. Alternatively or in addition, the at least two measurements of the I-V performance characteristic of the at least one of the plurality of first LEDs may include a plurality of fourth measurements that are made between the second measurement and the third measurement, wherein the plurality of fourth measurements have a decreasing frequency over time.

A first one of the plurality of first LEDs may correspond to a subset of the plurality of second LEDs, and a property of the bias current for driving the subset of the plurality of second LEDs may be determined as a function of at least two measurements of the I-V performance characteristic of the first one of the plurality of first LEDs. The subset of the plurality of second LEDs may be arranged in a row or a column.

The property of the first bias current may be determined as a function of at least two measurements of the I-V performance characteristic of each of the plurality of first LEDs. Each of the at least two measurements of the I-V performance characteristic may be determined as an average of respective measurements of the I-V performance characteristic of each of the plurality of first LEDs.

The property of the first bias current may be a length of time that the first bias current is applied. Alternatively or in addition, the property of the first bias current may be a magnitude of the first bias current. Alternatively or in addition, the property of the first bias current may include a data value corresponding to a target brightness provided by the first bias current. Alternatively or in addition, the property of the first bias current may be determined as a function of a difference between the at least two measurements of the I-V performance characteristic of the at least one of the plurality of first LEDs.

Each of the plurality of measurement circuits may include a comparator and a converter. The converter may include an analog-to-digital converter or a digital-to-analog converter.

According to another aspect of the invention, a method includes applying a first bias current to drive a first LED and a plurality of second LEDs, measuring a current-voltage (I-V) performance characteristic of the first LED at a plurality of times while the first bias current is applied to the first LED and the plurality of second LEDs, and modifying a property of the first bias current as a function of a difference in the I-V performance characteristic of the first LED at a first time and a second time within the plurality of times. The first LED may be arranged at an outer periphery region within a two-dimensional array of LEDs, and the plurality of second LEDs may be arranged at an interior region within the two-dimensional array of LEDs.

The property of the first bias current may be a length of time that the first bias current is applied. Alternatively or in addition, the property of the first bias current may be a magnitude of the first bias current. Alternatively or in addition, the property of the first bias current may include a data value corresponding to a target brightness provided by the first bias current.

BRIEF DESCRIPTION OF THE DRAWINGS

Illustrative embodiments are described with reference to the following figures.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Common display technologies today range from Liquid Crystal Displays (LCDs) to more recent Organic Light Emitting Diode (OLED) displays and Active Matrix Organic Light Emitting Diode (AMOLED) displays. Inorganic Light Emitting Diodes (ILEDs) are emerging as the third generation of flat display image generators based on superior battery performance and enhanced brightness. A "μLED," "uLED," or "MicroLED," described herein refers to a particular type of ILED having a small active light emitting area (e.g., less than 2,000 $\mu m^2$) and, in some examples, being capable of generating directional light to increase the brightness level of light emitted from the small active light emitting area. In some examples, a micro-LED may refer to an LED that has an active light emitting area that is less than 50 μm, less than 20 μm, or less than 10 μm. In some examples, the linear dimension may be as small as 2 μm or 4 μm. In some examples, the linear dimension may be smaller than 2 μm. For the rest of the disclosure, "LED" may refer μLED, ILED, OLED, or any type of LED devices.

Examples of the disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some examples, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

In some examples, an LED array may be used in a display device, which may be incorporated in an artificial reality system. As the display device is operated, the LEDs within the LED array experience aging, which may cause the performance of some of all of the LEDs to decrease. For example, the magnitude and the wavelength of the light that is emitted by an LED can change over time. This can diminish the user experience during the lifetime of the display device. Embodiments of the invention may compensate for these changes by monitoring the performance of the LEDs and adjusting the operating conditions of the LEDs. This may maintain the stability of the light output of the display device over time.

Figure 1:
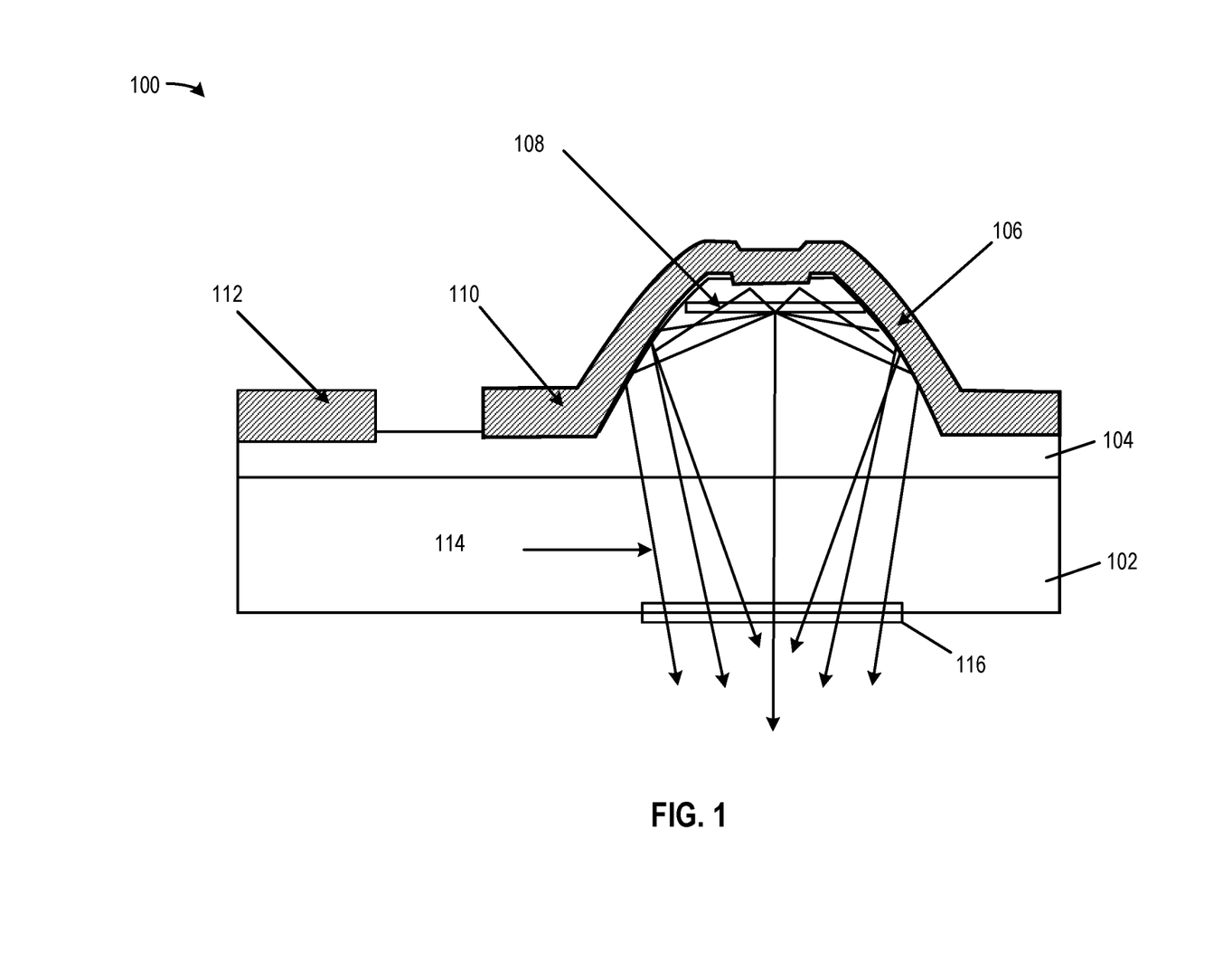
FIG. 1 shows a cross-sectional view of an example LED device that can be manufactured using examples of the disclosed techniques.

FIG. 1 shows a cross-sectional view of a μLED 100 according to some examples of the present disclosure. As shown in FIG. 1, μLED 100 includes, among others, a substrate 102, a semiconductor epitaxial layer 104 disposed on the substrate 102. Epitaxial layer 104 can be shaped into a mesa 106. An active layer 108, which can include quantum well structures configured to emit light of a pre-determined wavelength range when activated, can be included in mesa 106. Mesa 106 has a truncated top covered by a P-type contact pad 110, whereas a part of epitaxial layer 104 outside of mesa 106 may be covered by an N-type contact pad 112. An electric signal can be applied across P-type contact pad 110 and N-type contact pad 112 to activate active layer 108 to emit light 114. Moreover, mesa 106 also has a near-parabolic shape to form a reflective enclosure. The near-parabolic structure of mesa 106 can be etched directly onto the LED die during the wafer processing steps. Mesa 106 for a typical μLED can have a diameter of about 50 micrometers (μm) or less, whereas each of P-type contact pad 110 and N-type contact pad 112 may have a diameter of about 20 μm.

Light 114 emitted from active layer 108 can be reflected off the internal walls of mesa 106 toward light emitting surface 116 at an angle sufficient for the light to escape the μLED die 100 (i.e., within an angle of total internal reflection). Light 114 can form a quasi-collimated light beam as the light emerges from light emitting surface 116.

Figure 2A:
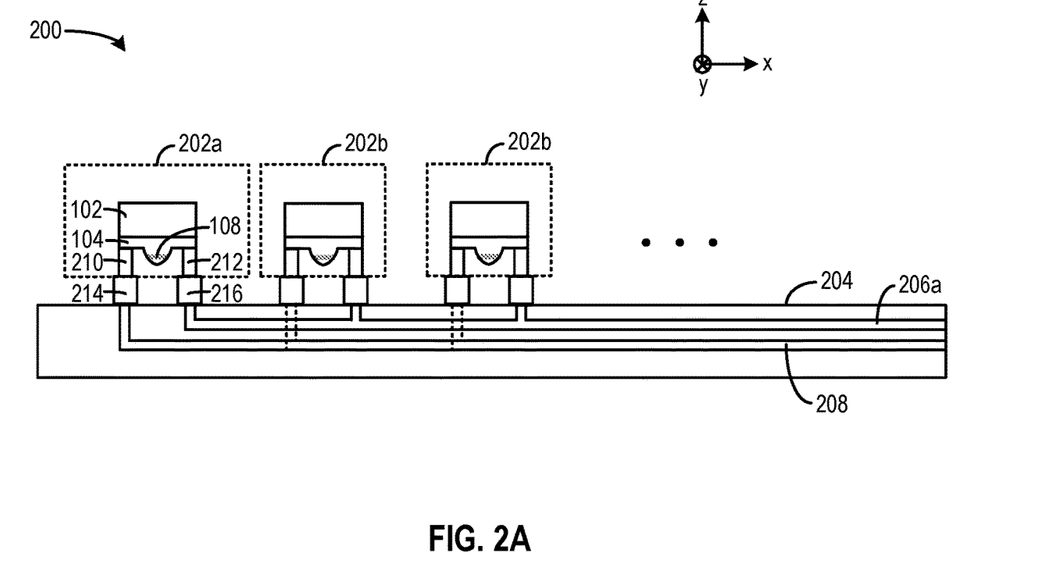
FIG. 2A, FIG. 2B, FIG. 2C, and FIG. 2D are schematic views of an example display that can be manufactured using examples of the disclosed techniques.
Figure 2B:
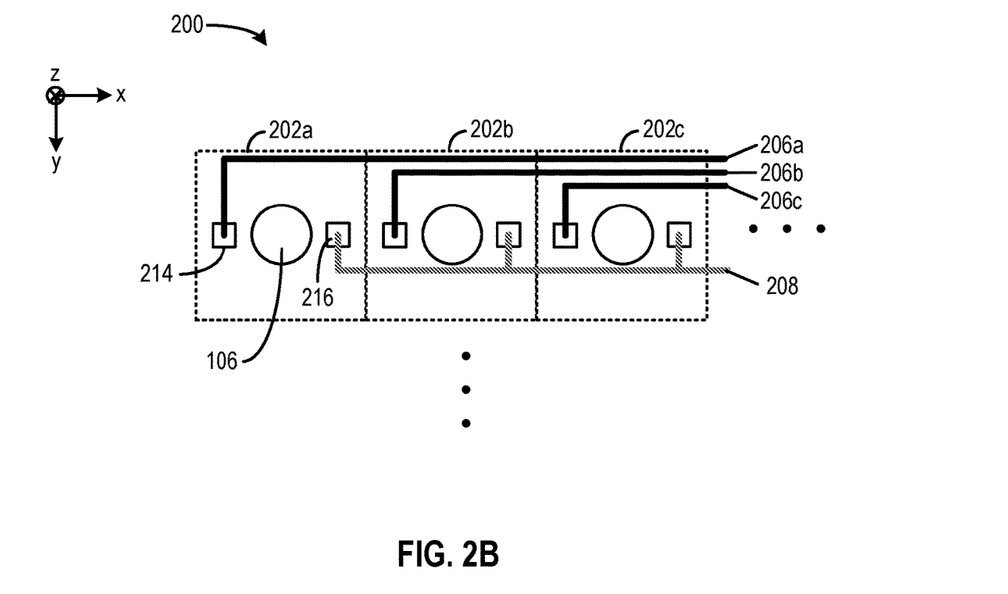

FIG. 2A and FIG. 2B show an example of a μLED display apparatus 200 according to some examples of the present disclosure. Although the examples of FIG. 2A and FIG. 2B are based on μLED devices, it is understood that the examples of FIG. 2A and FIG. 2B are applicable to other types of LED devices as well. FIG. 2A shows a cross-sectional view of the display apparatus, whereas FIG. 2B shows a top view of the display apparatus. As shown in FIG. 2A, μLED display 200 can include an array of μLED dies 202 including, for example, μLED die 202a, μLED die 202b, and μLED die 202c assembled on a backplane 204.

Backplane 204 may include a structure for attaching a plurality of μLED dies, to provide electrical connections and structural support for the plurality of μLED devices. As used herein, "backplane" may refer to any structure that provides a surface (which can be planar, curved, etc.) for attaching a plurality of LED devices (which may include μLED devices as described in this disclosure) and for providing electrical signals to the plurality of LED devices. The backplane can be configured as a display backplane to form a display device. For example, the backplane can hold assemblies of LED devices forming display elements, and the backplane may also include traces to provide electrical signals to the LED devices to control the information displayed by the display elements. Backplane 204 may comprise traces, which may connect to other components. Backplane 204 may also comprise electrical contact points, e.g., metal pads, which may provide access to the traces. For example, as shown in FIG. 2A and FIG. 2B, backplane 204 includes electrical traces 206a, 206b, and 206c to electrically connect with, respectively, μLED die 202a, μLED die 202b, and μLED die 202c. Electrical traces 206a, 206b, and 206c allow each of μLED die 202a, μLED die 202b, and μLED die 202c to be individually controlled by applying different signals. Backplane 204 also includes an electrical trace 208 to act as a return current path for each of μLED die 202a, μLED die 202b, and μLED die 202c. Backplane 204 may include different kinds of materials, such as Thin Film Transistor (TFT) glass substrate, polymer, polychlorinated biphenyl (PCB), etc. Although FIG. 2A illustrates that backplane 204 has a rectangular shape, it is understood that backplane 204 can have various shapes and sizes.

Each of μLED die 202a, μLED die 202b, and μLED die 202c can have a structure similar to μLED die 100 of FIG. 1. Each μLED die in FIG. 2A and FIG. 2B may include substrate 102, epitaxial layer 104, mesa 106, and active layer 108. In addition, each μLED die includes a device-side bump 210 and a device-side bump 212. While FIG. 2A and FIG. 2B illustrate that the bumps are of rectangular shape, it is understood that the bumps can take on other shapes including, for example, rounded shapes, dome shapes, etc. Device-side bump 210 can be connected to P-type contact pad 110 (not shown in FIG. 2A and FIG. 2B), whereas device-side bump 212 can be connected to N-type contact pad 112 (also not shown in FIG. 2A and FIG. 2B). Moreover, backplane 204 includes backplane-side bumps at each location for placing a μLED die. For example, backplane 204 includes backplane-side bumps 214 and 216 for μLED die 202a. Backplane 204 also includes metal pads (not shown in FIG. 2A) which serve as a foundation on which backplane-side bumps 214 and 216 are deposited, and to provide electrical contact to traces 206 and 208. Conductive bonding (e.g., metallic bonding) can be formed between the bumps of the μLED dies and the contacts to provide electrical paths between the μLED die and backplane 204.

Figure 2C:
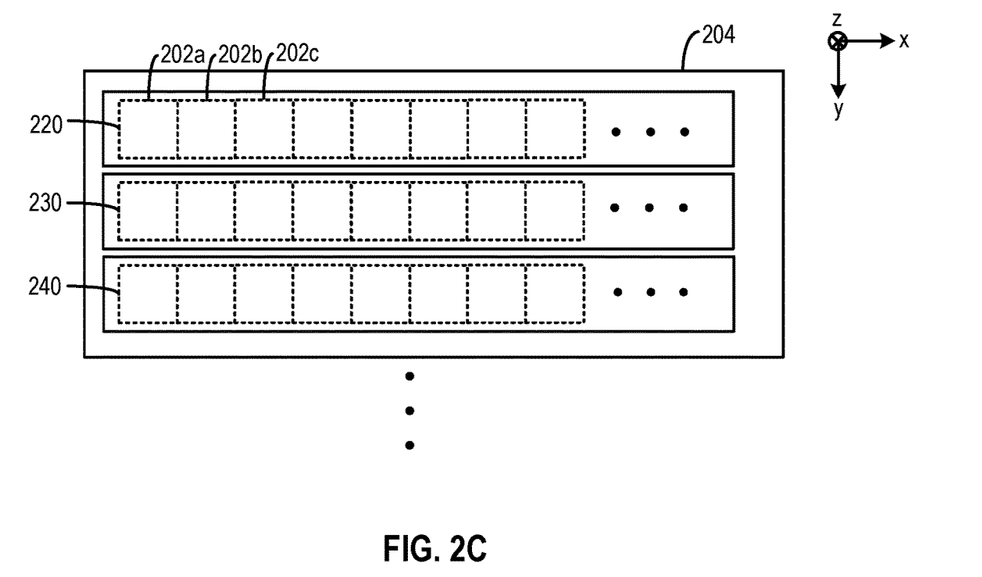
Figure 2D:
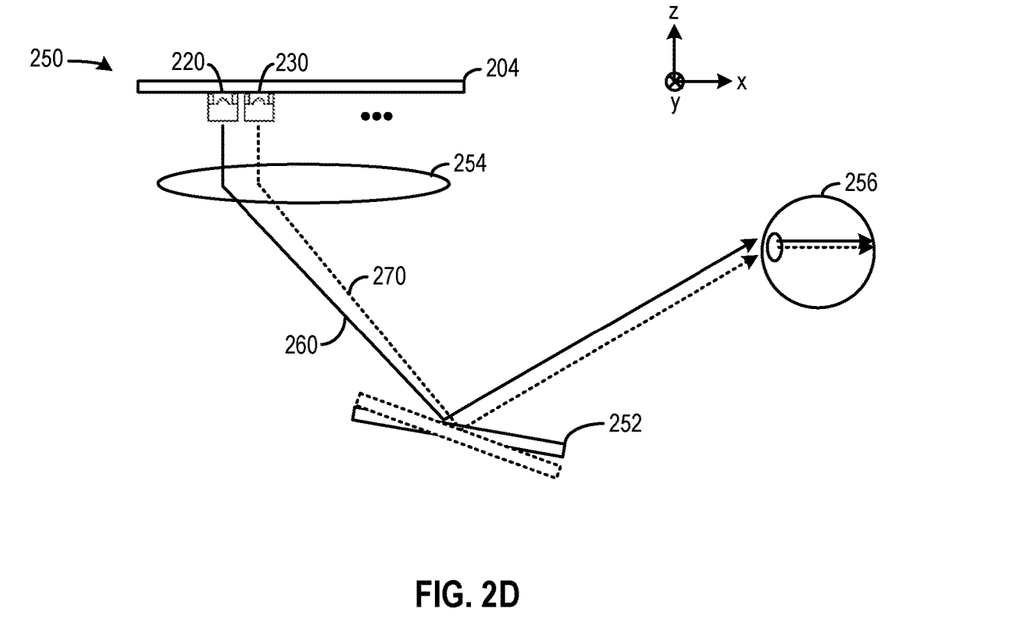

In some examples, μLED display apparatus 200 can be configured as a scanning display in which the LEDs configured to emit light of a particular color are formed as a strip (or multiple strips). For example, as shown in FIG. 2C, a plurality of μLED dies including μLED die 202a, μLED die 202b, and μLED die 202c, etc. can be assembled along an X-axis to form a μLED strip 220 configured to emit green light on backplane 204. In addition, backplane 204 also includes a μLED strip 230 configured to emit red light and an LED strip 240 configured to emit blue light.

μLED strips 220, 230, and 240, as well as additional strips of red, green and blue μLEDs, can be assembled along a Y-axis as parallel strips on backplane 204 to form a scanning display. FIG. 2D illustrates an example of a scanning display 250 comprising μLED display apparatus 200, a mirror 252, and a lens 254. In scanning display 250, each strip of LEDs can be configured to emit light of a particular color (e.g., one of red, green, or blue). For example, μLED strip 220 can emit green light 260, μLED strip 230 can emit red light 270, etc. The lights can be converged by lens 254 and reflected by mirror 252 into eyeball 256 of a person. To perform sequential scanning, each strip of μLEDs can be controlled to emit light to project a line of pixels of an image onto the retina of eyeball 256. The projection of each line of pixels can be sequential. Through the rotating action of mirror 252, each line of pixels can be projected at different points at different times on the retina, to create the perception of the image.

Figure 3:
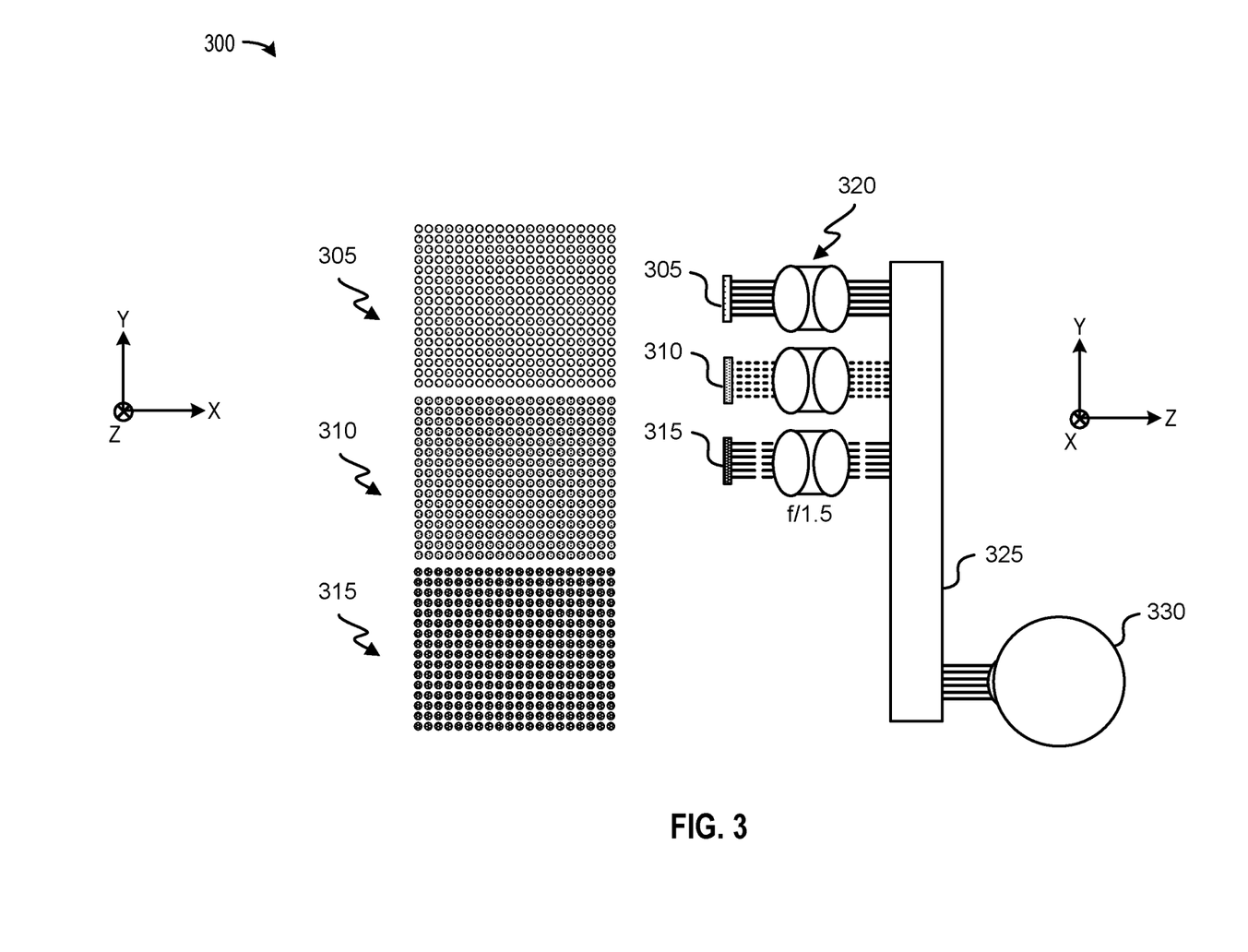
FIG. 3 illustrates an example of a display device that includes three arrays of LEDs that are coupled to a waveguide, according to examples of the disclosed techniques.

FIG. 3 illustrates an example of a display device 300 that includes three arrays of LEDs that are coupled to a waveguide. The LEDs may be μLEDs. As shown on the left-hand side of FIG. 3, the display device 300 may include a first array 305 of LEDs that are configured to emit red light, a second array 310 of LEDs that are configured to emit green light, and a third array 315 of LEDs that are configured to emit blue light. As shown on the right-hand side of FIG. 3, collimating lenses 320 may be provided to collimate light from each of the arrays 305, 310, and 315 of LEDs. One collimating lens 320 may be provided for each array 305, 310, and 315 of LEDs. Further, a single waveguide 325 may be provided to receive light from the collimating lenses 320 and to direct light toward the user's eye 330.

Figure 4:
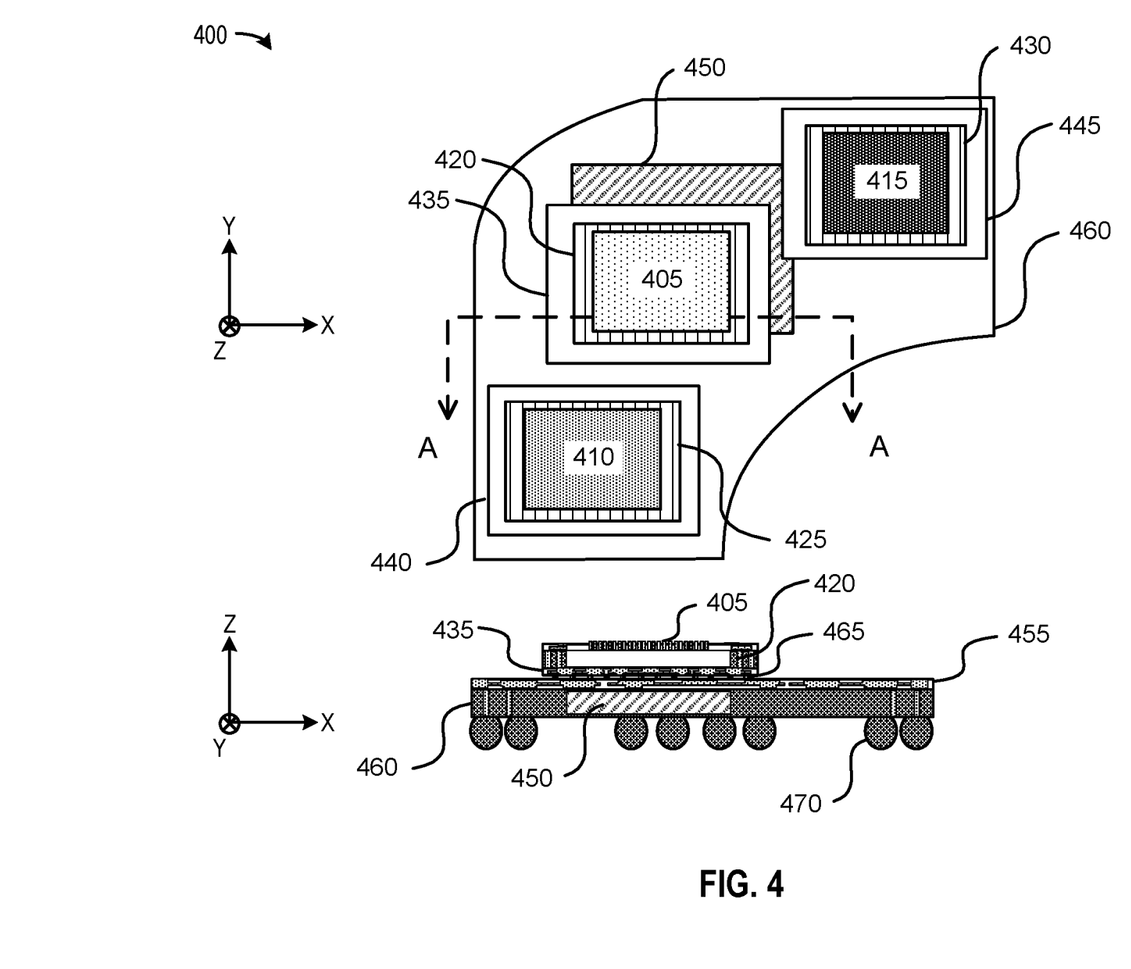
FIG. 4 illustrates an example of a display device that includes three arrays of LEDs that are coupled to a waveguide, according to examples of the disclosed techniques.

FIG. 4 illustrates an example of a display device 400 that includes three arrays of LEDs that are coupled to a waveguide. The LEDs may be μLEDs. As shown in the top portion of FIG. 4, display device 400 may include a first die 420, a second die 425, and a third die 430, which are mounted on a backplane 460 via I/O bumps 465. The dies 420, 425, and 430 may be LED dies. A first array 405 of LEDs that are configured to emit red light may be mounted on the first die 420, which may include driver circuits for the first array 405 of LEDs. A second array 410 of LEDs that are configured to emit green light may be mounted on the second die 425, which may include driver circuits for the second array 410 of LEDs. A third array 415 of LEDs that are configured to emit blue light may be mounted on the third die 430, which may include driver circuits for the third array 415 of LEDs. The dies 420, 425, and 430 are configured to be co-planar along the z direction, but may be staggered in any suitable configuration along the x direction and/or the y direction. A first additional layer 435, such as a first fan-out circuit, may be provided between the first die 420 and the backplane 460. A second additional layer 440, such as a second fan-out circuit, may be provided between the second die 425 and the backplane 460. A third additional layer 445, such as a third fan-out circuit, may be provided between the third die 430 and the backplane 460. The backplane 460 may have driver and graphics functions. The backplane 460 may include a backplane die 450 that is positioned underneath at least one of the dies 420, 425, or 430, and that drives the dies 420, 425, and 430.

The bottom portion of FIG. 4 shows a cross-section taken along line A-A labeled in the top portion of FIG. 4. As shown in the bottom portion of FIG. 4, a redistribution layer 455 may be provided to allow the dies 420, 425, and 430 to interface with the backplane 460 such that the dies 420, 425, and 430 are not required to be positioned entirely or exactly on top of the backplane 460. Additional I/O bumps 470 may be provided on the underside of the backplane 460 in order to provide a connection between the backplane 460 and a sensor aggregation chip (not shown), and to supply power to the integrated circuit, including the dies 420, 425, and 430.

Figure 5:
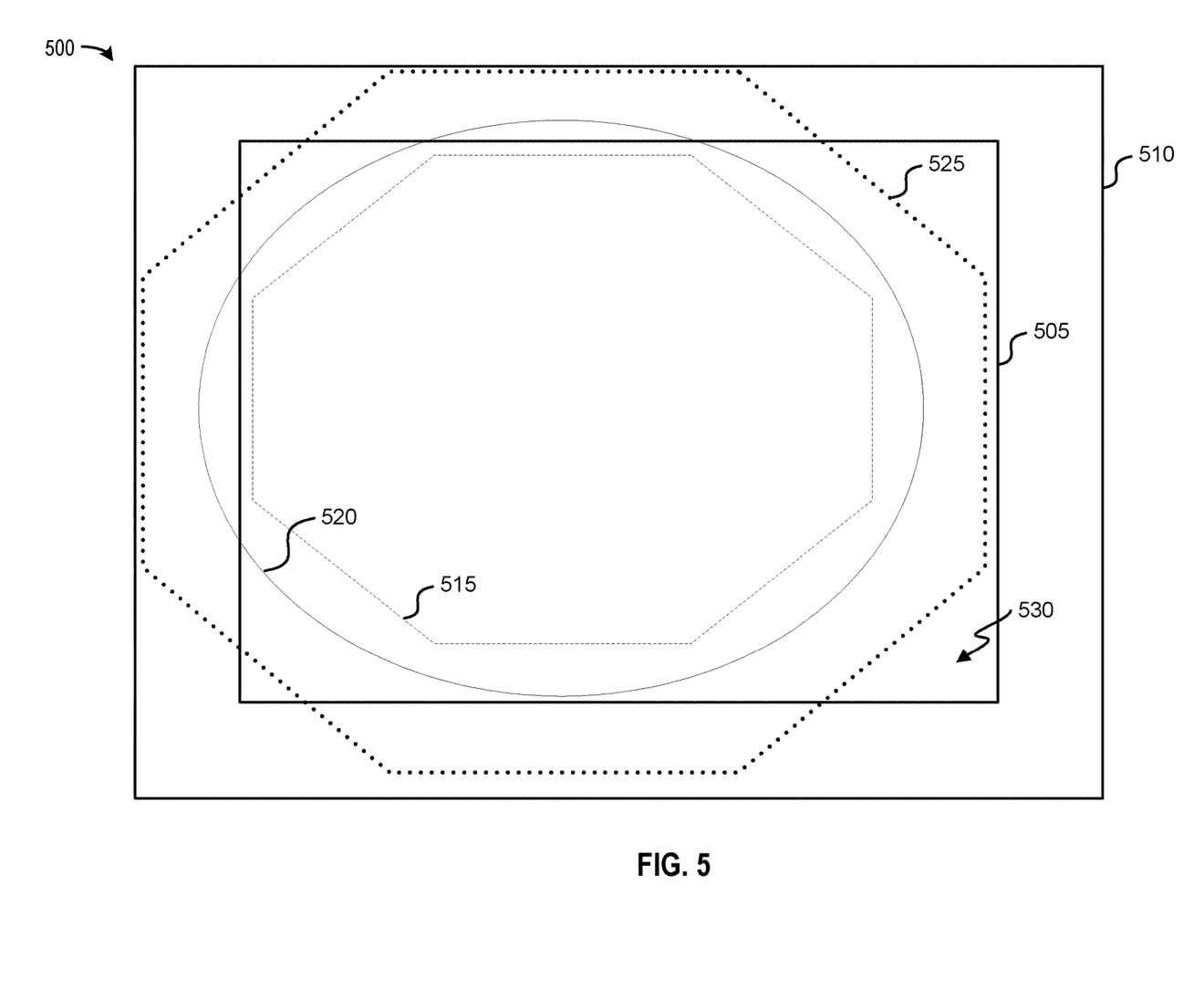
FIG. 5 illustrates an example of a system that includes an array of LEDs having a plurality of display LEDs and a plurality of test LEDs.

FIG. 5 illustrates an example of a system 500 that includes an array 505 of LEDs having a plurality of display LEDs and a plurality of test LEDs. The LEDs may be μLEDs. For example, the array 505 of LEDs may be a rectangular array of LEDs that includes 1080×1920 LEDs. Each of the LEDs may be configured to emit red, green, or blue light. As discussed above, the array 505 of LEDs may be mounted on a die 510, which may include driver circuits for the array 505 of LEDs.

A subset of the LEDs that are arranged within an interior region 515 of the array 505 of LEDs may be display LEDs that are used to provide light to the user's eye. The interior region 515 may be shifted with respect to the center of the array 505 of LEDs, and may have an octagonal shape. The location of the interior region 515 may be determined by the alignment of a lens with respect to the array 505 of LEDs. For example, the lens may be one of the collimating lenses 320 shown in FIG. 3. The portion of the lens that provides light to the eye 330 may define a field of view 520 as shown in FIG. 5. The interior region 515 of the array 505 of LEDs may be within the field of view 520. The rest of the LEDs within the array 505 of LEDs may be arranged within an outer periphery region, which may be defined as the portion of the array 505 of LEDs that is outside of the interior region 515.

Some or all of the LEDs within the outer periphery region may be used as test LEDs. Each of the test LEDs may correspond to one or more of the display LEDs. The association between a test LED and one or more of the display LEDs may be temporary or permanent. For example, a test LED may initially be associated with a subgroup of the display LEDs, and later may be associated with a different subgroup of the display LEDs. In some examples, a first test LED may correspond to a plurality of the display LEDs that are arranged in a row or a column.

An aperture 525 may be used to block light from LEDs within the outer periphery region from reaching the lens and causing unwanted light to reach the eye of the user. In the example shown in FIG. 5, the aperture may be a plate that is arranged between the array 505 of LEDs and the lens. The plate may have an opening that passes light from the display LEDs to the lens, but blocks light from at least some of the test LEDs from reaching the lens. The plate may also block light that is reflected from the surface of the die 510 from reaching the lens. In addition, the plate may block light from outside of the display device from reaching the lens. The test LEDs may be positioned within a corner 530 of the array 505 of LEDs that is blocked by the aperture 525. Each corner 530 may include at least 4 to 16 LEDs that are always available to use as test LEDs, regardless of the alignment of the lens with respect to the array 505 of LEDs, because light from these LEDs cannot reach the lens. In other examples, the aperture 525 may be provided by applying ink, paint, and/or metal to a light-emitting surface of the test LEDs, such that the light is reflected or absorbed by the ink, paint, and/or metal. For example, the ink, paint, and/or metal may be applied to the light-emitting surface of the test LEDs by ink jet printing or screen printing.

For each test LED, a controllable current source is used to generate a bias current that drives the test LED and the corresponding display LEDs. A single controllable current source may be used to drive all of the test LEDs, or a plurality of controllable current sources may be used to drive subsets of the test LEDs. In one example, a separate controllable current source may be provided for each test LED. Because the test LEDs and the corresponding display LEDs are driven with the same bias current, they are expected to age in a similar manner. A measurement circuit may be provided to measure a current-voltage (I-V) performance characteristic of the test LED, which is assumed to be representative of the I-V performance characteristic of each of the associated display LEDs. A single measurement circuit may be used to measure all of the test LEDs, or a plurality of measurement circuits may be used to measure subsets of the test LEDs. In one example, a separate measurement circuit may be provided for each test LED. Methods of measuring the I-V performance characteristic of the test LED are discussed in further detail below.

Various characteristics of the light that is output by each LED in the array 505 of LEDs, such as the wavelength and the magnitude of the light, may change as the display device is used. For example, changes in the I-V performance characteristic of the test LED may be representative of changes in the light output of the test LED. Accordingly, the I-V performance characteristic of the test LED may be measured at various times during the lifetime of the display device. For example, the I-V performance characteristic of the test LED may be measured upon completion of manufacturing of the display device, upon turning on the display device, and after turning off the display device. Further, a series of measurements of the I-V performance characteristic of the test LED may be obtained between turning on the display device and turning off the display device. Because the I-V performance characteristic is likely to vary the most immediately after the display device is turned on, the series of measurements of the I-V performance characteristic may be obtained with a decreasing frequency over time. For example, the I-V performance characteristic may be measured every second, then every minute, then every 30 minutes, then every hour.

The measurements of the I-V performance characteristic of the test LED as a function of time may be used to compensate for changes in the light output of the associated display LEDs. For example, the colors of the LEDs should remain matched and the intensity of the light output should remain uniform. At least two measurements of the I-V performance characteristic of a test LED may be compared to identify any changes in the light output of the test LED. For example, a first measurement of the I-V performance characteristic may be obtained upon completion of manufacturing of the display device, and a second measurement of the I-V performance characteristic may be made upon turning on the display device.

Embodiments of the invention may compensate for these changes by adjusting the operating conditions of the LEDs. Various properties of the bias current that is applied to the LEDs may be changed. For example, the bias current may be applied for a longer time or a shorter time. Alternatively or in addition, the magnitude of the bias current may be increased or decreased. Alternatively or in addition, a data value corresponding to a target brightness provided by the bias current may be adjusted. For example, the brightness of the pixel is controlled by the bias current that flows through the LED and its time duration. The data voltage is the voltage that is applied to the gate of the driving transistor, which controls the bias current. Therefore, a higher data voltage implies a higher bias current, and a lower data voltage implies a lower bias current. These changes may be applied to a single display LED, a subset of the display LEDs, or all of the display LEDs.

In some examples, sensors may be provided to measure the light that is output from the display LEDs. For example, a luminance meter may be used to measure the luminance from one of the display LEDs, a subset of the display LEDs, or all of the display LEDs. The measured luminance may also be used to adjust the operating conditions of the LEDs.

Figure 6A:
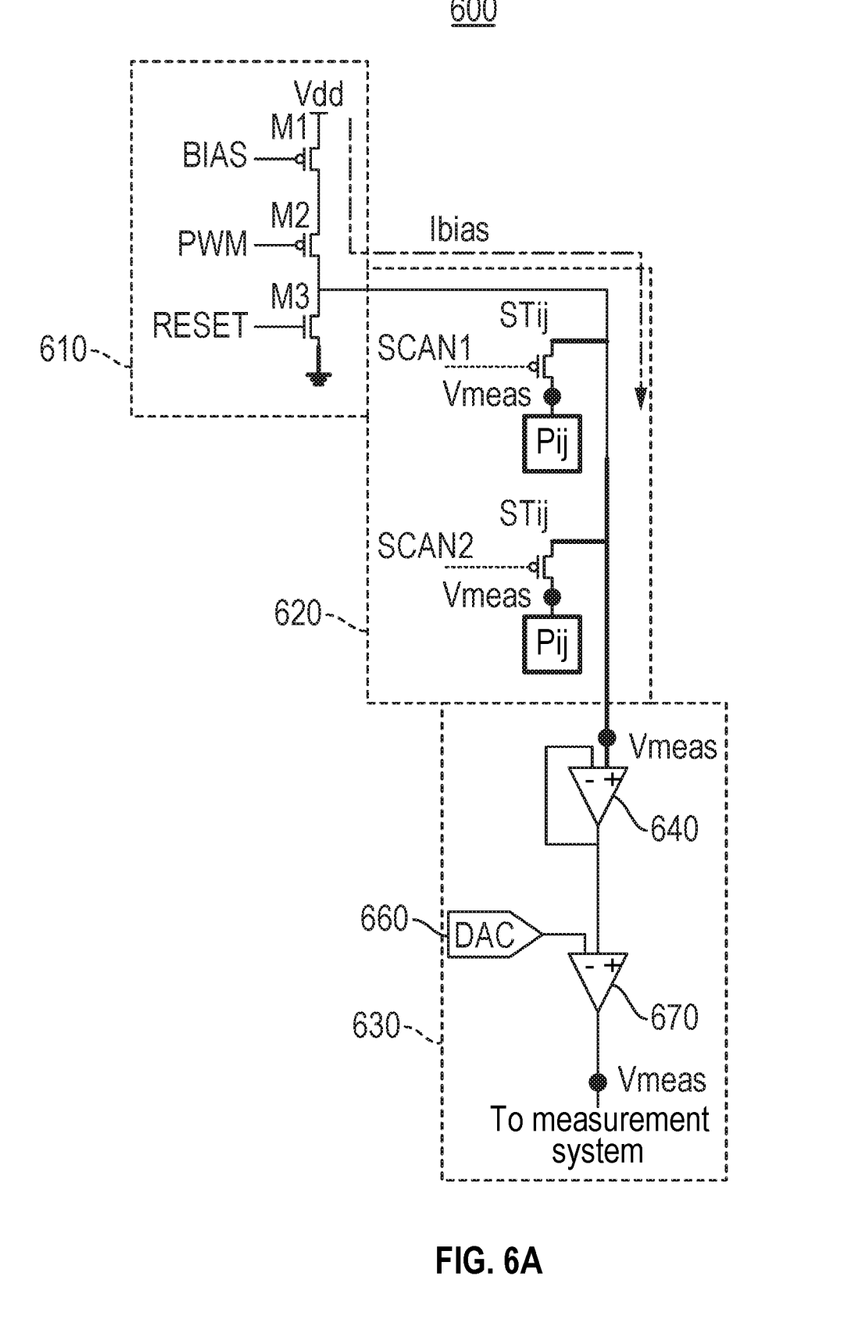
FIGS. 6A and 6B illustrate examples of devices for measuring the I-V performance characteristic of the test LED, according to examples of the disclosed techniques.
Figure 6B:
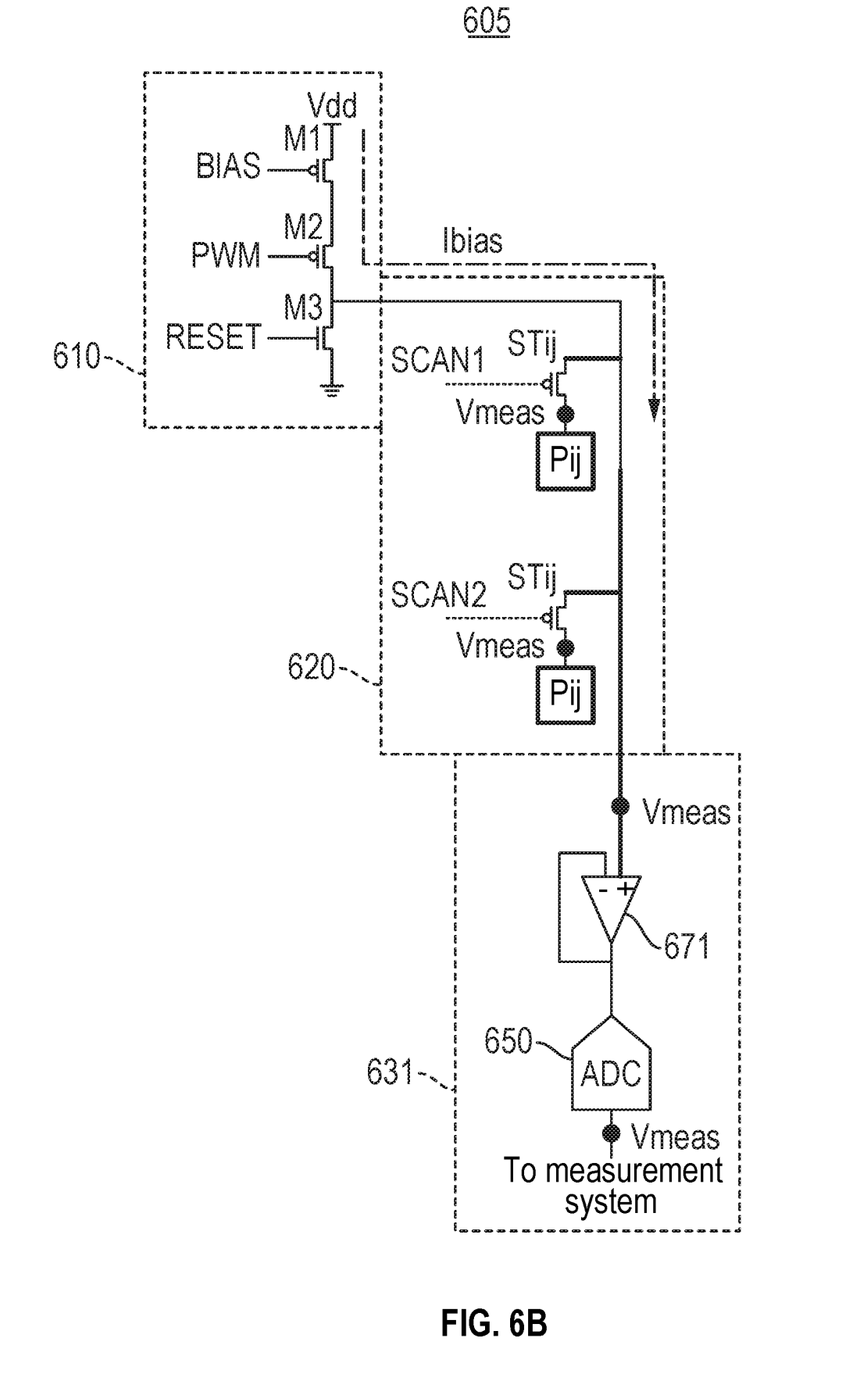

FIGS. 6A and 6B illustrate examples of devices for measuring the I-V performance characteristic of the test LED according to embodiments of the disclosure. For example, FIGS. 6A and 6B show a Display Driver Integrated Circuit (DDIC) 610 and an Active Array 620. The DDIC refers to display driver circuitry that provides driving current to the LEDs in the Active Array. The term "DDIC," as used in the present disclosure, does not necessarily refer to a separate integrated circuit that is apart from the Active Array. In fact, the DDIC and the Active Array may be bonded together, forming a monolithic integrated circuit chip. The DDIC 610 is a controllable current source that provides bias current Ibias to the Active Array 620. As shown in FIGS. 6A and 6B, the DDIC 610 may include three transistors M1, M2, and M3. Transistor M1 controls the bias current Ibias, transistor M2 controls the pulse width modulation (PWM) pulses, and transistor M3 is used for reset. A drive voltage Vdd is used to drive the DDIC 610, which is connected to ground at the source node of transistor M3. The Active Array 620 includes a multi-dimensional array of LEDs, such as a 2D array of LEDs. The LEDs may be micro-LEDs. Each micro-LED Pij is connected to a respective switch transistor STij to form a pixel. In one example, an Active Array 620 including 1080×1920 LEDs may be implemented. For ease of explanation, one dimension may be referred to as "columns," and the other dimension may be referred to as "rows," even though the labels "columns" and "rows" may be interchanged, and they do not necessarily dictate the orientation of the Active Array 620. In this example, there may be 1080 columns and 1920 rows. In other examples, there may be a different number of columns and/or rows. A display may include three Active Arrays 620, such that one Active Array 620 is provided for each of three colors, such as red, green, and blue.

According to various embodiments, multiple LEDs in each row of LEDs may be driven in parallel at any given time. One row may be driven sequentially after another row is driven. Thus, in the 1080×1920 example, the driving currents may be provided to the 1080 LEDs in a particular row simultaneously. This may be achieved by use of scan line signals. For example, referring to FIG. 6A, the "SCAN 1" signal may be turned on to direct the driving current Ibias for the present column, coming from the DDIC 610, to the particular LED in the present row. At the same time, other scan line signals (e.g., "SCAN 2," SCAN 3," etc.) may be turned off so as to disconnect other LEDs in the same column from the driving current Ibias. Alternatively, the driving currents may be provided to 54 of the 1080 LEDs in a particular row simultaneously, and then a multiplexer with a 20:1 switch may be used to change the LEDs that are being driven. The 20:1 switch allows all 1080 LEDs in a row to be driven by the 54 driving currents, because 20×54=1080.

As discussed, the DDIC 610 may either be a separate integrated circuit chip apart from the Active Array 620 or may be integrated with the array itself. When the DDIC 610 and the Active Array 620 are built separately, they may be bonded together, forming a monolithic integrated circuit chip. Various embodiments of the interconnection between the DDIC 610 and the Active Array 620 are possible. The Active Array 620 may have two opposite sides, i.e., a light-emitting side and a contact side. Each LED Pij may be formed from an epitaxial layered structure and have a P-contact and an N-contact by which a current may be applied to activate the LED Pij. The LED Pij may be arranged to emit light on the light-emitting side, while having its P-contact and N-contact exposed on the contact side of the Active Array 620. The contact side of the Active Array 620 may be bonded, e.g., using metal bumps or by other means, to a backplane that includes the DDIC 610. Such a backplane may be referred to as the DDIC backplane and may be implemented using, for example, a CMOS-based integrated circuit technology. According to one embodiment, the Active Array 620 and the DDIC backplane, bonded together, forms a single LED integrated chip. Multiple ones of such LED integrated chips may be combined to form a display.

An example of the measurement procedure is as follows: the bias current Ibias is applied to the LED Pij through the switch transistor STij, and the SCAN1 signal enables the measurement circuit 630 to sense the voltage Vmeas at the input to the buffer 640, which may be assumed to be close to the voltage Vmeas of the LED Pij. For example, the voltage Vmeas at the input to the buffer 640 may be equal to the voltage Vmeas of the LED Pij, or may be different from the voltage Vmeas of the LED Pij by a few mV. In this way a data pair including the bias current Ibias and the voltage Vmeas can be obtained. Then the bias current Ibias is increased and the voltage Vmeas is measured again. In this way, the entire I-V curve can be collected. In one example, the maximum bias current Ibias is 6 µA and the minimum current step for the bias current Ibias is 63 nA, giving roughly 100 current points for measurement. The measurement circuit 230 outputs a digital representation of the voltage Vmeas to a measurement system, which collects, processes, and saves the voltage measurements. The measurement system may include a memory device for storing each bias current Ibias and voltage Vmeas as a data pair, thereby forming an I-V curve for the LED Pij.

FIGS. 6A and 6B illustrate two alternative measurement devices for obtaining a digital value representing the measured voltage Vmeas. FIG. 6A shows a device 600 that uses a DAC-based measurement circuit 630, and FIG. 6B shows a device 605 that uses an ADC-based measurement circuit 631. As shown in FIG. 6A, the DAC-based measurement circuit 630 utilizes a buffer 640, a Digital-to-Analog Converter (DAC) 660, and a comparator 670. In this configuration, the DAC-based measurement circuit 630 senses the voltage Vmeas and compares it with a reference voltage Vref. Vref is digitally controlled and generated using the DAC 660, and it is "ramped" up. Vref increases until it is equal to or greater than Vmeas and then the comparator 670 changes its output state. This triggering condition, indicating that the analog values Vref≥Vmeas, causes the measurement system to record the digital value provided to the DAC 660 at the moment that the comparator 670 changes its output state. The digital value thus reflects the voltage measurement Vmeas. A 10-bit DAC 660 may ramp the reference voltage Vref from 0 V to 5 V through $2^{10}$ levels (or 1024 levels) in order to identify the measured voltage Vmeas. The DAC-based measurement circuit 630 may use 2n clock cycles to achieve a resolution of n bits. The measurement system may include a memory device for storing the digitized voltage Vmeas and the bias current Ibias as a data pair, and for storing a plurality of data pairs as an I-V curve.

By contrast, the ADC-based measurement circuit 631 shown in FIG. 6B utilizes a buffer 671 and an ADC 650. For example, the ADC-based measurement circuit 631 may perform a binary search for the measured voltage Vmeas using m clock cycles for n bits of resolution or accuracy (n≤m≤2n). Again, the measurement system may include a memory device for storing the digitized voltage Vmeas and the bias current Ibias as a data pair, and for storing a plurality of data pairs as an I-V curve.

Figure 7:
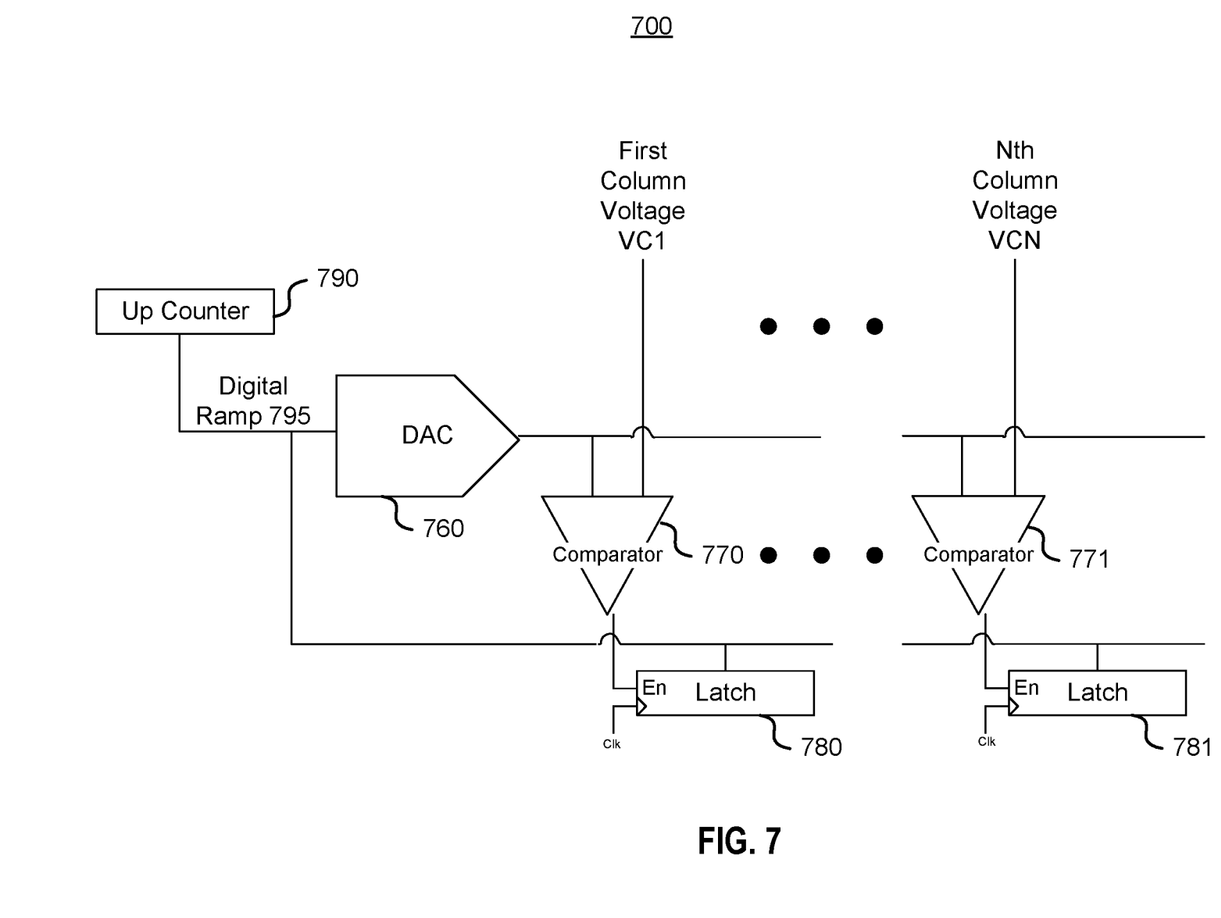
FIG. 7 illustrates a specific implementation of a DAC-based measurement circuit, according to examples of the disclosed techniques.

FIG. 7 presents a specific implementation of a DAC-based measurement circuit 700, according to an embodiment of the disclosure. Here, LED voltages VC1 . . . VCN from multiple columns of the Active Array are measured. In this particular example, each column that is measured has a dedicated comparator 770 . . . 771 and latch 780 . . . 781 to latch the output of the comparator 770 . . . 771. However, there is only one DAC 760 and one up-counter 790 that is shared among the multiple columns. This particular design takes advantage of the fact that the digital ramp 795 generated by the up-counter 790, as well as the analog form of the ramp signal that is provided by the DAC 760, can be shared across the multiple columns of LEDs being measured. In this implementation, there is no need to separately generate either the digital ramp signal 795 or the analog ramp signal for different columns. However, before stepping the bias current to the next step/level for I-V curve generation, all comparators must trip or change states before the digital ramp 795 can be reset. In other examples, a separate DAC 760 may be provided for each column or for each of a plurality of groupings of columns.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

The invention claimed is:

1. A device comprising:
    a plurality of first light-emitting diodes (LEDs);
    a plurality of second LEDs;
    at least one controllable current source that is configured to generate at least one bias current for driving the plurality of first LEDs and the plurality of second LEDs; and
    a plurality of measurement circuits, each of the plurality of measurement circuits being configured to measure a current-voltage (I-V) performance characteristic of one or more of the plurality of first LEDs, wherein:
    a property of a first bias current of the at least one bias current is determined as a function of at least two measurements of an I-V performance characteristic of at least one of the plurality of first LEDs,
    the at least two measurements of the I-V performance characteristic of the at least one of the plurality of first LEDs are acquired by one or more of the plurality of measurement circuits while the first bias current is applied to the at least one of the plurality of first LEDs and the plurality of second LEDs, and
    the at least two measurements of the I-V performance characteristic of the at least one of the plurality of first LEDs are acquired at different times.

2. The device of claim 1, wherein the at least two measurements of the I-V performance characteristic of the at least one of the plurality of first LEDs comprise a first measurement that is made upon completion of manufacturing of the device and a second measurement that is made upon turning on the device.

3. The device of claim 2, wherein the at least two measurements of the I-V performance characteristic of the at least one of the plurality of first LEDs further comprise a third measurement that is made after turning off the device.

4. The device of claim 3, wherein the at least two measurements of the I-V performance characteristic of the at least one of the plurality of first LEDs further comprise a plurality of fourth measurements that are made between the second measurement and the third measurement, and wherein the plurality of fourth measurements have a decreasing frequency over time.

5. The device of claim 1, wherein:
    the plurality of first LEDs are divided into subsets of first LEDs,
    each of the subsets of first LEDs is associated with a respective subset of second LEDs,
    the at least one of the plurality of first LEDs belongs to a first subset among the subsets of first LEDs, and
    the subset of second LEDs with which the first subset among the subsets of first LEDs is associated is the plurality of second LEDs.

6. The device of claim 5, wherein the plurality of second LEDs are arranged in a row or a column.

7. The device of claim 1, wherein the at least two measurements of the I-V performance characteristic of the at least one of the plurality of first LEDs comprise at least two measurements of an I-V performance characteristic of each of the plurality of first LEDs.

8. The device of claim 7, wherein each of the at least two measurements of the I-V performance characteristic of said each of the plurality of first LEDs is determined as an average I-V performance characteristic of the plurality of first LEDs.

9. The device of claim 1, wherein the property of the first bias current is a length of time that the first bias current is applied.

10. The device of claim 1, wherein the property of the first bias current is a magnitude of the first bias current.

11. The device of claim 1, wherein the property of the first bias current comprises a data value corresponding to a target brightness provided by the first bias current.

12. The device of claim 1, wherein the function of the at least two measurements of the I-V performance characteristic of the at least one of the plurality of first LEDs is a function of a difference between the at least two measurements of the I-V performance characteristic of the at least one of the plurality of first LEDs.

13. The device of claim 1, wherein:
each of the plurality of measurement circuits comprises a comparator and a converter, and the converter comprises an analog-to-digital converter or a digital-to-analog converter.

14. A method comprising:
applying a first bias current to drive a first light-emitting diode (LED) and a plurality of second LEDs;
measuring a current-voltage (I-V) performance characteristic of the first LED at a plurality of times while the first bias current is applied to the first LED and the plurality of second LEDs; and
modifying a property of the first bias current as a function of a difference between the I-V performance characteristic of the first LED at a first time within the plurality of times and the I-V performance characteristic of the first LED at a second time within the plurality of times.

15. The method of claim 14, wherein:
the first LED is arranged at an outer periphery region within a two-dimensional array of LEDs, and
the plurality of second LEDs are arranged at an interior region within the two-dimensional array of LEDs.

16. The method of claim 14, wherein the property of the first bias current is a length of time that the first bias current is applied.

17. The method of claim 14, wherein the property of the first bias current is a magnitude of the first bias current.

18. The method of claim 14, wherein the property of the first bias current comprises a data value corresponding to a target brightness provided by the first bias current.

19. The device of claim 1, wherein:
the plurality of first LEDs are arranged at an outer periphery region within a two-dimensional array of LEDs, and
the plurality of second LEDs are arranged at an interior region within the two-dimensional array of LEDs.

* * * * *